US010715141B2

(12) United States Patent
Lee

(10) Patent No.: US 10,715,141 B2
(45) Date of Patent: Jul. 14, 2020

(54) CAPACITIVE KEYBOARD KEYS WHICH TRANSLATE PRESSING INPUT INTO OUTPUT RESPONSE SPEED

(71) Applicant: CHICONY ELECTRONICS CO., LTD., New Taipei (TW)

(72) Inventor: Yen-Ching Lee, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 16/233,794

(22) Filed: Dec. 27, 2018

(65) Prior Publication Data

US 2020/0076432 A1 Mar. 5, 2020

(30) Foreign Application Priority Data

Aug. 31, 2018 (TW) .............................. 107130624 A

(51) Int. Cl.
*G06F 3/023* (2006.01)
*H03K 17/96* (2006.01)
*G06F 3/02* (2006.01)

(52) U.S. Cl.
CPC ....... *H03K 17/9622* (2013.01); *G06F 3/0202* (2013.01); *G06F 3/023* (2013.01)

(58) Field of Classification Search
CPC .. G06F 3/044; H03K 17/9622; H03K 17/975; H03K 17/00; H01H 2239/06
See application file for complete search history.

(56) References Cited

U.S. PATENT DOCUMENTS 6,927,763 B2 * 8/2005 La Monica ........... G06F 3/0233
178/18.06
9,997,309 B2 * 6/2018 Yao .......................... H01H 1/02

FOREIGN PATENT DOCUMENTS

CN 101908874 A 12/2010
CN 204392223 U 6/2015
TW M547171 8/2017

* cited by examiner

*Primary Examiner* — Vanessa Girardi
(74) *Attorney, Agent, or Firm* — Muncy, Geissler, Olds & Lowe, P.C.

(57) ABSTRACT

The present invention discloses a keyboard, which includes a base plate, a plurality of key structures, a circuit board, and a capacitance sensing module. The base plate includes a plurality of opening portions. The key structures are respectively disposed in the opening portions. The circuit board is disposed on a surface of the base plate. The capacitance sensing module includes a plurality of sensing units and a controlling unit. The sensing units are respectively disposed in a plurality of clear areas, and the clear areas are proximal to the key structures. The controlling unit is disposed on the circuit board. The controlling unit is electrically connected to the sensing units. When the key structure is pressed, the corresponding sensing unit generates a capacitance variation in accordance with a pressed degree of the key structure, and controlling unit generates a capacitance variation value.

17 Claims, 6 Drawing Sheets

CAPACITIVE KEYBOARD KEYS WHICH TRANSLATE PRESSING INPUT INTO OUTPUT RESPONSE SPEED

BACKGROUND OF THE INVENTION

1. Field of the Invention

The present invention relates to a keyboard.

2. Description of the Related Art

According to the current computer use habits, keyboard is one of the indispensable input devices. In general, a keyboard has a plurality of key structures, and each time the key structures are pressed, only a single trigger signal is generated, and a single input signal is generated correspondingly. In other words, when one of the keys is pressed, the same input signal is generated and corresponds to the same operation command regardless of the degree of pressing (half or fully pressed). For a general keyboard used to process documents or used in offices, a single key structure corresponding to a single input signal meets the user's needs. However, when esports players use the gaining keyboard to control the actions of the game target, such as forward, backward, rotation and jump, they usually hope to simultaneously control the speed of aforementioned actions.

The current design utilizes a light-reflective sensing module to obtain the depth (degree) at which the key structures are pressed. Also, different input signals are generated according to different pressed depths, and the different input signals are correspond to different speed commands. For example, an infrared emitting unit and infrared sensing units are provided at the bottom of the key structures, and infrared rays are emitted in the direction of the keycap, and the infrared sensing units receive the infrared rays reflected from the keycap, thereby obtaining the depth at which the keycap is pressed and generating different input signals. However, the use of light reflection requires an additional infrared emitting unit and infrared sensing units and increases the manufacturing cost. Besides, the key structures require extra space to set up the infrared emission unit and infrared sensing units.

SUMMARY OF THE INVENTION

In view of the above issues, it is a major objective of the present invention to provide a keyboard with a capacitance sensing module including sensing units and a controlling unit. When the key structures proximal to the sensing units are pressed, the controlling unit generates a capacitance variation value. The processing module can determine a pressed degree of the key structures according to the capacitance variation value, and generates a corresponding input signal to solve the problem caused by the principle of light reflection by the conventional gaining keyboard.

To achieve the above objective, the present invention provides a keyboard. The keyboard includes a base plate, a plurality of key structures, circuit board and a capacitance sensing module. The base plate includes a plurality of opening portions. The key structures are respectively disposed in the opening portions. The circuit board is disposed on a surface of the base plate. The capacitance sensing module includes a plurality of sensing units and a controlling unit. The sensing units are respectively disposed in a plurality of clear areas, and the clear areas are proximal to the key structures. The controlling unit is disposed on the circuit board. The controlling unit is electrically connected to the sensing units. When the key structure is pressed, the corresponding sensing unit generates a capacitance variation in accordance with a pressed degree of the key structure, and controlling unit generates a capacitance variation value.

According to an embodiment of the present invention, the keyboard further includes a processing module, which is electrically connected to the controlling unit of the capacitance sensing module, and receives the capacitance variation value. The processing unit according to the capacitance variation value generates a corresponding input signal.

According to an embodiment of the present invention, when the key structure is pressed by a conductor, the corresponding sensing unit generates the capacitance variation according to a distance difference from the conductor, and wherein the controlling unit detects the capacitance variation and generates a capacitance variation value.

According to an embodiment of the present invention, the processing module includes a memory unit that stores a capacitance variation input signal comparison table including a plurality of capacitance variation segments and the corresponding input signals. The processing module determines that the capacitance variation value is in the range of one of the capacitance variation segments, and generates a corresponding input signal.

According to an embodiment of the present invention, the processing module includes a memory unit that stores a pressed depth input signal comparison table including a plurality of pressed depth segments and the corresponding input signals. The processing module calculates to obtain a pressed depth according to the capacitance variation value, determines that the pressed depth is in the range of one of the pressed depth segments, and generates a corresponding input signal.

According to an embodiment of the present invention, the processing module includes a memory unit that stores a capacitance variation pressed depth comparison table including a plurality of capacitance variation segments and a corresponding pressed depth. The processing module obtains a pressed depth according to the capacitance variation value.

According to an embodiment of the present invention, the sensing unit is a conductive member.

According to an embodiment of the present invention, the clear areas are disposed on a surface of the circuit board, and a metal coating layer is coated on each of the clear areas. The metal coating layers is used as sensing unit.

According to an embodiment of the present invention, the clear areas are disposed in the key structures. Also, the key structure includes a first sheet metal spring and a second sheet metal spring disposed opposite to each other.

According to an embodiment of the present invention, the controlling unit is electrically connected to the first sheet metal spring, and the first sheet metal spring is used as a sensing unit.

According to an embodiment of the present invention, when the key structure is pressed, the first sheet metal spring and the second sheet metal spring are in contact with each other, and generate a trigger signal, and the processing module correspondingly generates an input signal.

According to an embodiment of the present invention, the key structures proximal to the clear areas are a plurality of arrow keys.

According to an embodiment of the present invention, the arrow keys include the key structures corresponding to up, down, left, right, and A, S, D, or W key.

To achieve the above objective, the present invention also provides a keyboard. The keyboard includes a base plate, a plurality of key structures, circuit board and a capacitance sensing module. The base plate includes a plurality of opening portions. The key structures are respectively disposed in the opening portions. The circuit board is disposed on a surface of the base plate. The capacitance sensing module includes a plurality of sensing units and a controlling unit. The sensing units are respectively disposed in a plurality of clear areas on a surface of the circuit board, and the clear areas are respectively proximal to the key structures. The controlling unit is disposed on the circuit board. The controlling unit is electrically connected to the sensing units. When the key structure is pressed, the corresponding sensing unit generates a capacitance variation in accordance with a pressed degree of the key structure, and controlling unit generates a capacitance variation value.

According to an embodiment of the present invention, the sensing unit is a metal coating layer.

According to an embodiment of the present invention, the keyboard further includes a processing module. The processing module is electrically connected to the controlling unit of the capacitance sensing module and receives the capacitance variation value. The processing module according to the capacitance variation value generates a corresponding input signal.

As described above, the keyboard according to the present invention includes a capacitance sensing module and a processing module. The capacitance sensing module includes a plurality of sensing units and a controlling unit. The sensing units are respectively disposed on the clear areas proximal to parts of the key structures. The controlling unit is disposed on a circuit board, and is electrically connected to the sensing units. When the key structures proximal to the sensing units are pressed, the controlling unit can detect and obtain a capacitance variation value. The processing module generates a corresponding input signal according to the capacitance variation value. The capacitance variation value may vary depending on the depth at which the key structures are pressed. The processing module can determine the pressed degree of the key structures according to different capacitance variation values, and generate a corresponding input signal. In other words, through the principle of capacitance variation, the effect that a single key structure can generate multiple different input signals can be achieved. Moreover, due to the small size of the sensing units of the capacitance sensing module, the sheet metal spring of the key structures can be directly used as the sensing units. Compared with the conventional keyboard using the light reflection principle, the keyboard according to the present invention can save space and reduce the manufacturing cost.

DETAILED DESCRIPTION OF THE PREFERRED EMBODIMENT

Hereafter, the technical content of the present invention will be better understood with reference to preferred embodiments.

Figure 1:
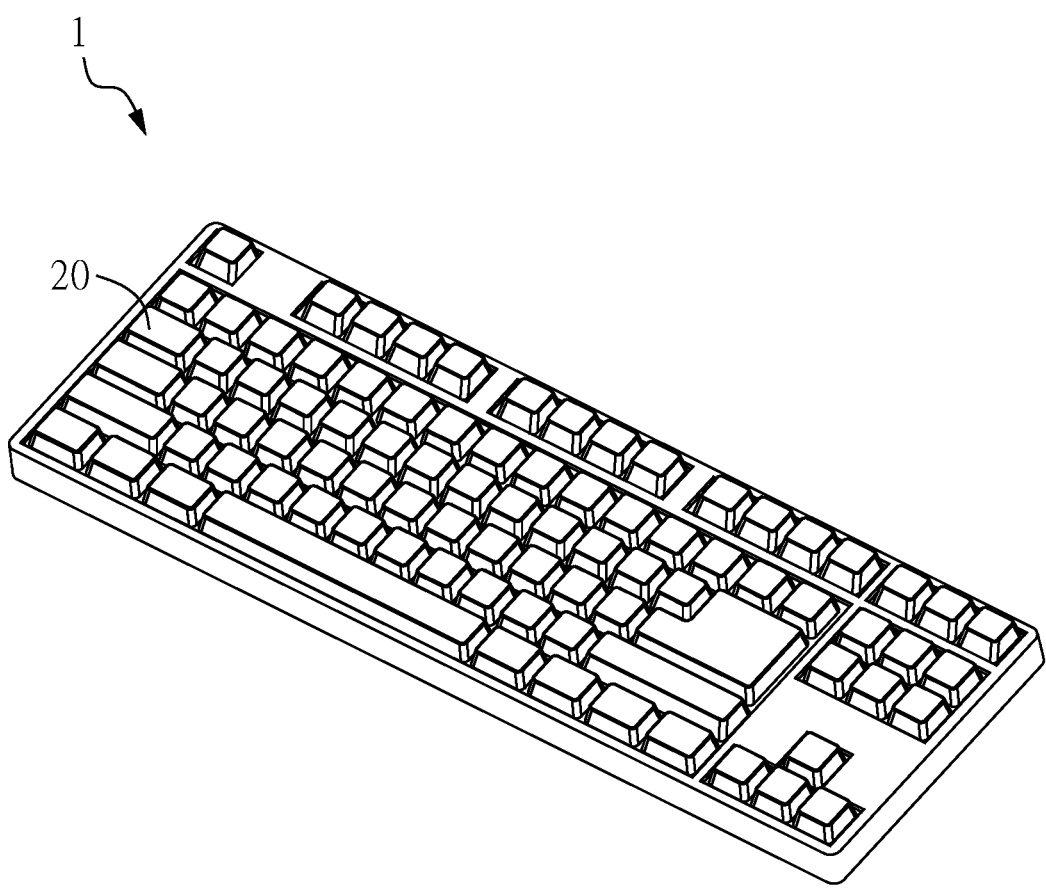
FIG. 1 is a schematic diagram of a keyboard in an embodiment of the present invention.
Figure 2:
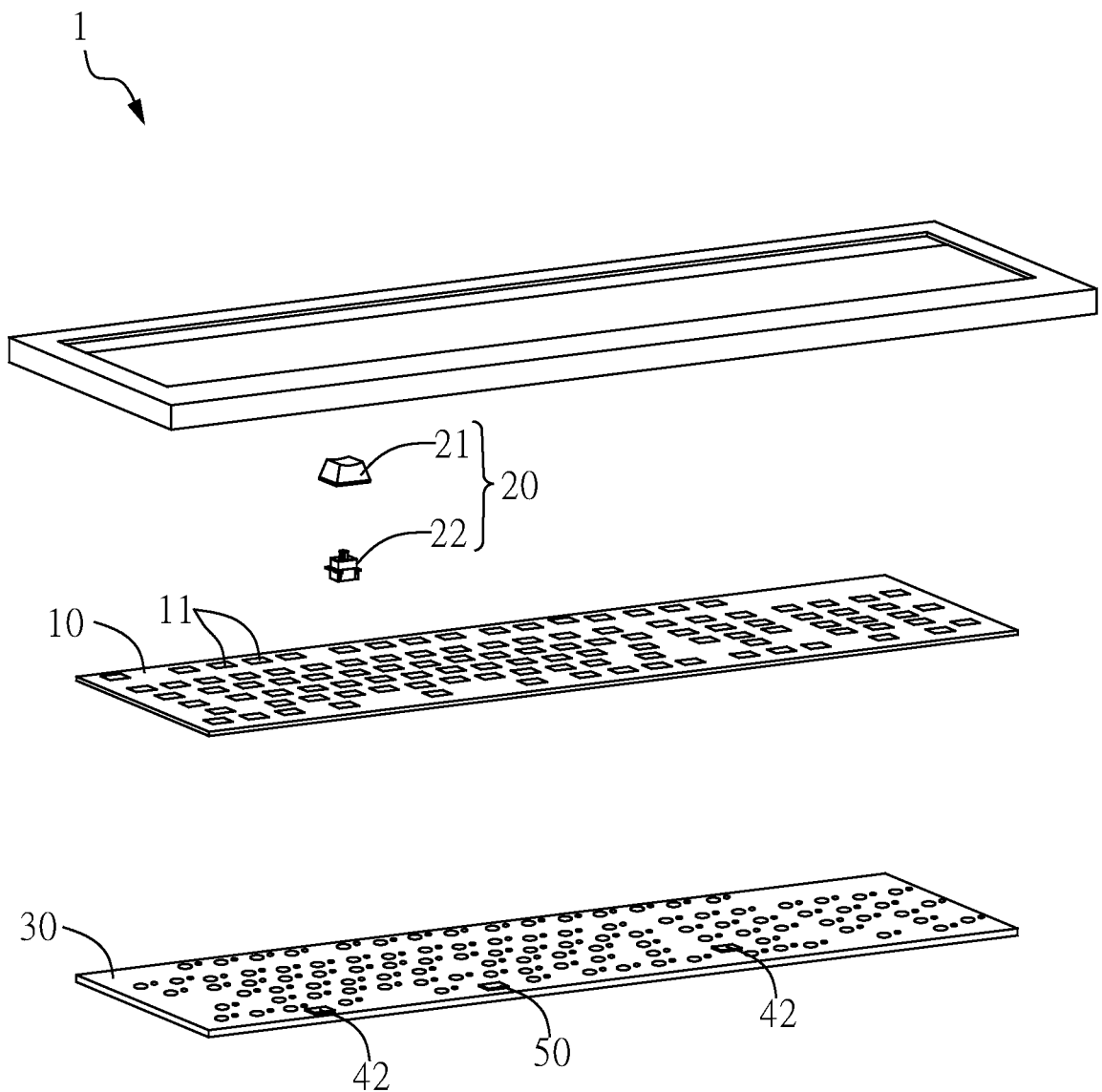
FIG. 2 is an exploded view of the keyboard shown in FIG. 1.
Figure 3:
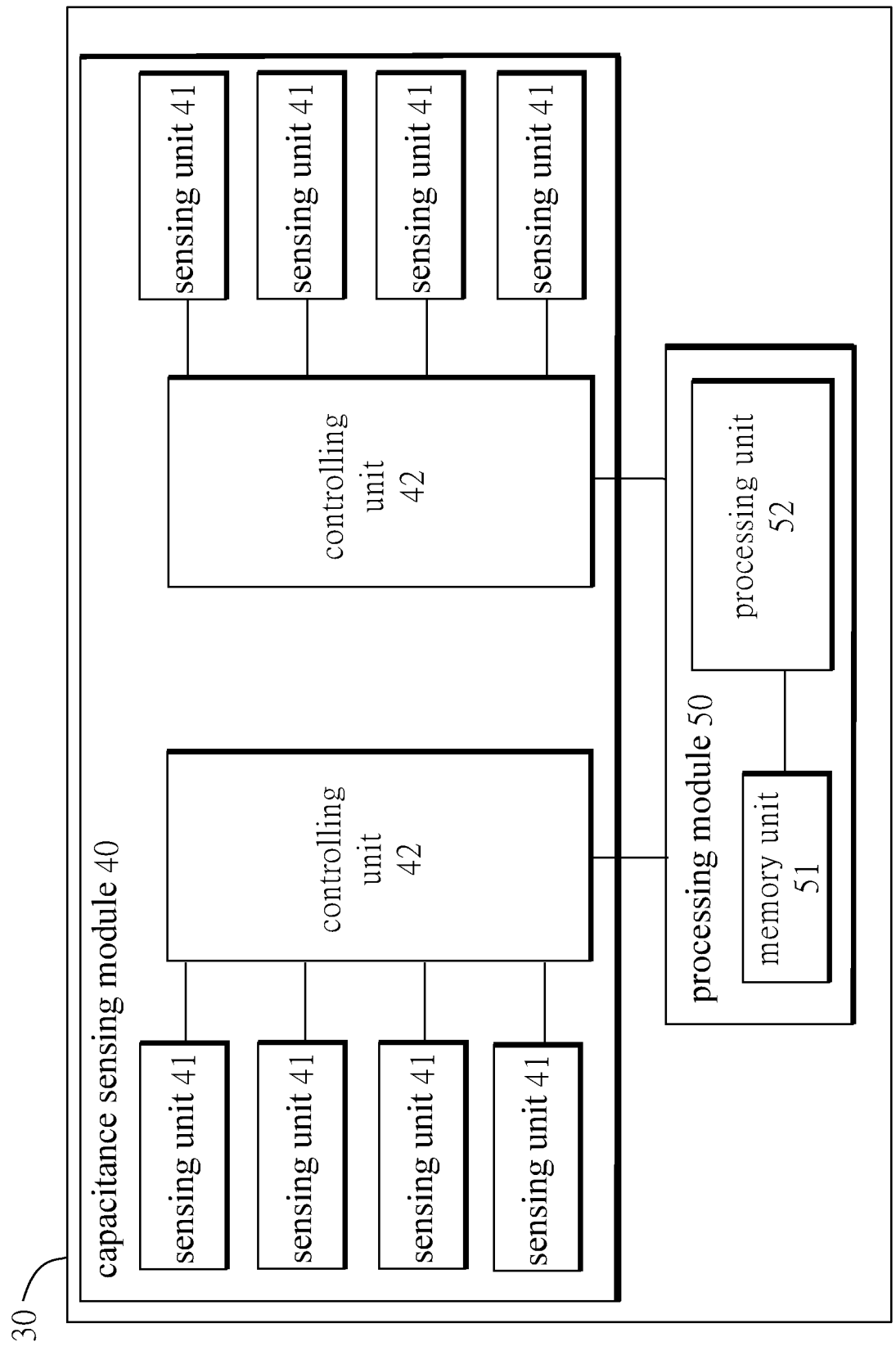
FIG. 3 is a block diagram of a capacitance sensing module and a processing module in an embodiment of the present invention.

FIG. 1 is a schematic diagram of a keyboard in an embodiment of the present invention; FIG. 2 is an exploded view of the keyboard shown in FIG. 1; and FIG. 3 is a block diagram of a capacitance sensing module and a processing module in an embodiment of the present invention. Please refer to FIG. 1, FIG. 2, and FIG. 3. A keyboard 1 in the present embodiment includes a base plate 10, a plurality of key structures 20, a circuit board 30, a capacitance sensing module 40 and a processing module 50. The circuit board 30 is disposed on a surface of the base plate 10. The circuit board 30 in the present embodiment is stacked on the lower surface of the base plate 10. The base plate 10 includes a plurality of opening portions 11 for receiving the key structures 20. The key structures 20 pass through the opening portions 11 to be accommodated in the opening portions 11, respectively, and fixed to the base plate 10.

Figure 4:
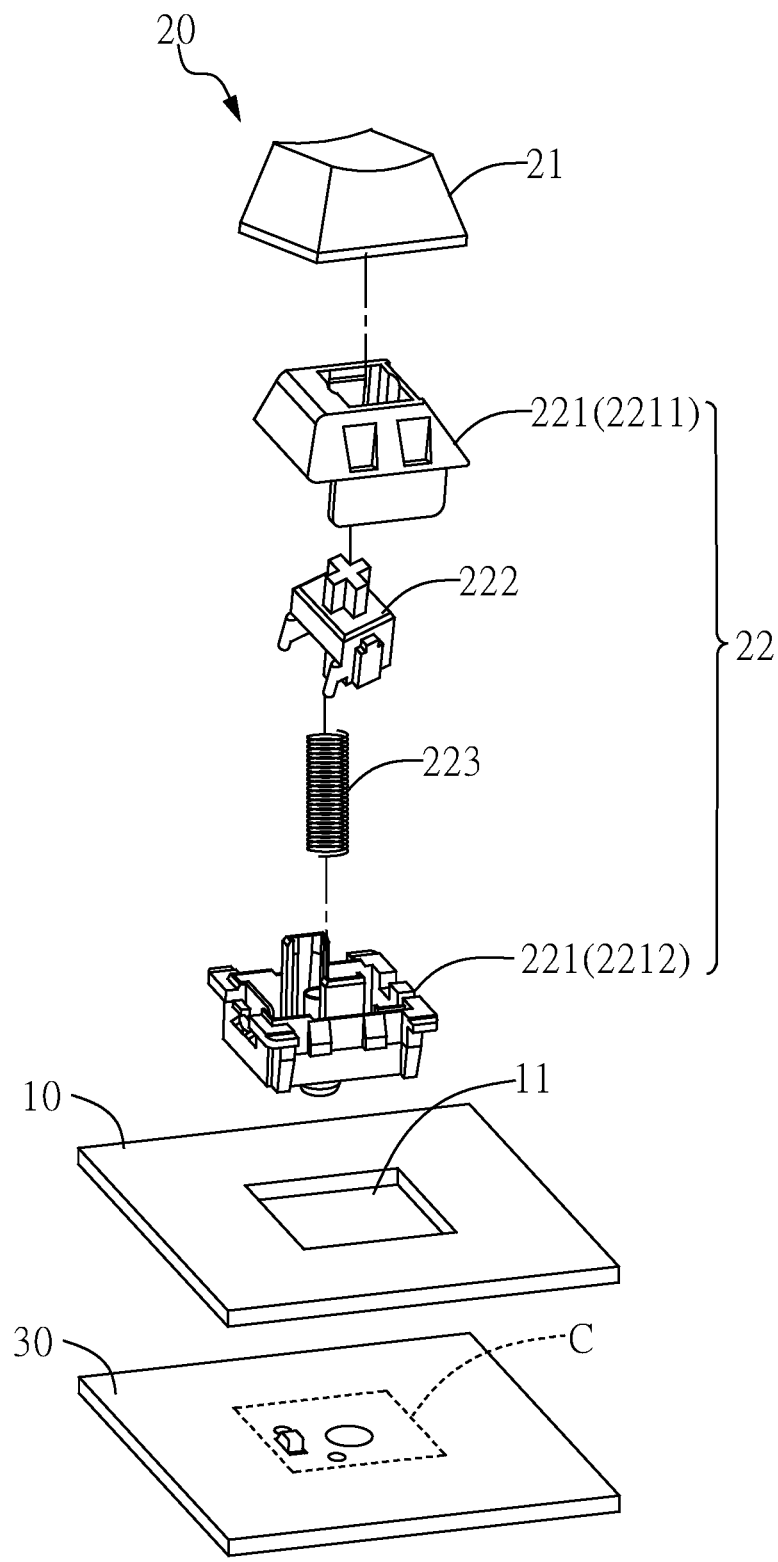
FIG. 4 is an exploded view of the key structures shown in FIG. 2.

In the present embodiment, the keyboard 1 may be a gaining keyboard, and the key structures 20 may be mechanical keys. The key structures 20 each include a keycap 21 and a key switch 22. The keycap 21 is assembled on the key switch 22, and the key switch 22 passing through the opening portions 11 is electrically connected to the circuit board 30. FIG. 4 is an exploded view of the key structures shown in FIG. 2. Referring to FIG. 4, the key switch 22 includes a housing 221, a pressing member 222, and an elastic member 223. The housing 221 is provided through the opening portions 11, the elastic member 223 sleeves on the pressing member 222, and the pressing member 222 and the elastic member 223 are accommodated in the housing 221. In the present embodiment, the housing 221 includes an upper housing 2211 and a lower housing 2212. The upper housing 2211 has a through hole through which one end of the pressing member 222 passes through the upper housing 2211 and is connected to the keycap 21.

Referring to FIG. 3, the capacitance sensing module 40 includes a plurality of sensing units 41 and a controlling unit 42. In the present embodiment, the sensing units 41 are conductive members, and the controlling unit 42 is disposed on a circuit board 30. The controlling unit 42 is electrically connected to the sensing units 41 to output a constant voltage to the sensing units 41, and can detect the capacitance variation of the sensing units 41. In other words, the sensing units 41 in the present embodiment are the sensing area for detecting the capacitance variation. In the present embodiment, the sensing units 41 are respectively disposed in the clear areas C proximal to the key structures 20 (as described hereafter). When the user presses one of the key structures 20, the user's finger (a conductor) approaches the sensing unit 41 in accordance with the pressed degree, such that the sensing unit 41 generates a capacitance variation due to the capacitive coupling effect. Then, the controlling unit 42 can detect the capacitance variation and generate a capacitance variation value. Specifically, the controlling unit 42 can detect different capacitance values according to the pressed depth as the user presses the key structure 20.

The key structures 20 in the present embodiment may be key structures for controlling the speed of the game target, e.g. arrow keys. The key structures corresponding to the up, down, left, and right functions are arrow keys, and the key structures of the A, S, D, and W keys on the gaining keyboard are also often used as arrow keys. The key structures 20 in the present embodiment may be the key structures of the A, S, D, and W keys. The sensing units 41 of the capacitance sensing module 40 are disposed in the clear areas C proximal to the aforementioned arrow keys. In other words, the sensing units 41 in the present embodiment are respectively disposed in the clear areas C respectively proximal to the key structures 20. As a specific example, the key structures 20 are the key structures of a plurality of arrow keys, e.g. the key structures corresponding to the up, down, left, and right functions, or the key structures corresponding to the A, S, D, and W keys.

In the present embodiment, the capacitance sensing module 40 can include two controlling units 42 each having four pins. One of the controlling unit 42 can be electrically connected to the four sensing units 41 of the key structures 20 corresponding to the upper, lower, left and right functions, respectively; the other controlling unit 42 can be electrically connected to the four sensing units 42 of the key structures 20 of the A, S, D, and W keys, respectively. In other embodiments, the capacitance sensing module 40 includes a controlling unit 42 having eight pins that are electrically connected to the eight sensing units 41 proximal to the aforementioned arrow keys.

Figure 5:
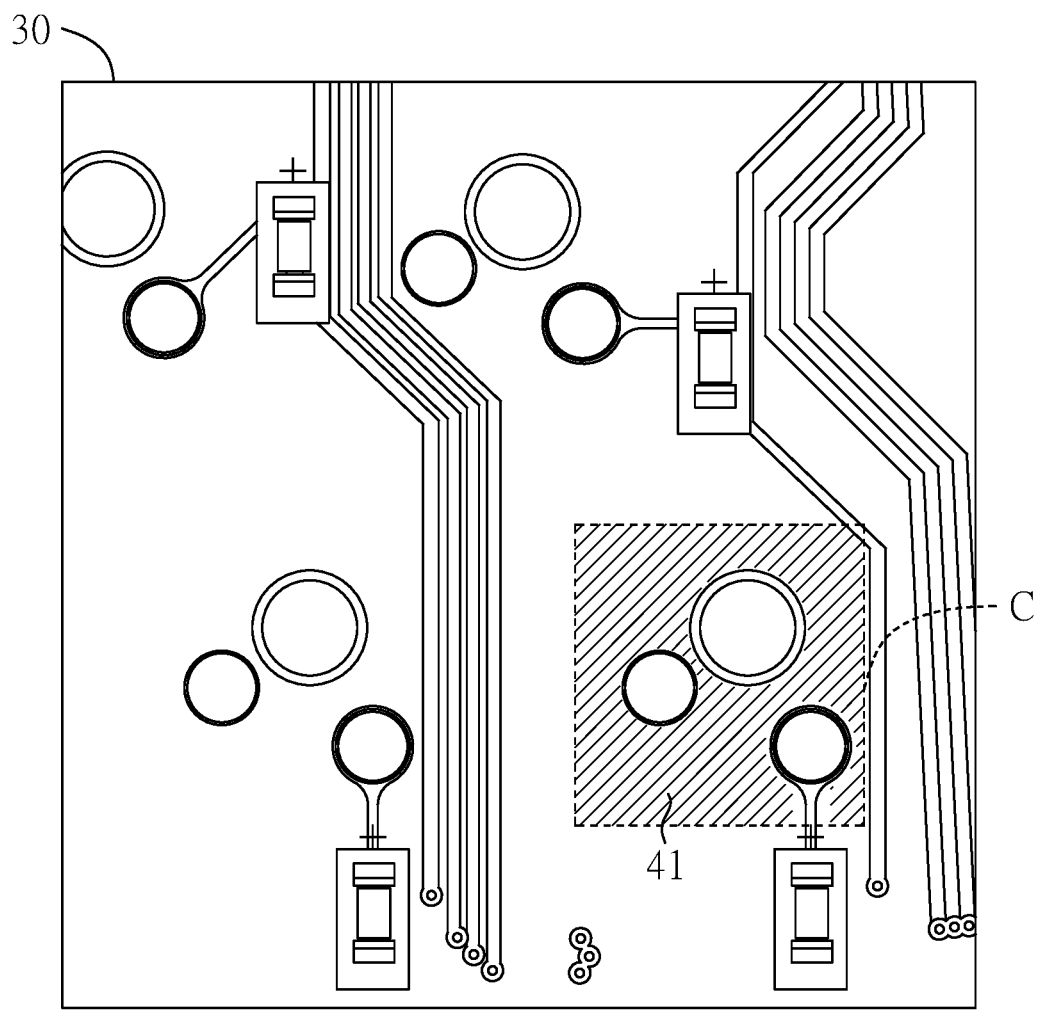
FIG. 5 is a partial schematic diagram of the lower surface of the circuit board shown in FIG. 2.

The clear area C referred to in the present embodiment indicates a region that does not have a conductive material, that is, a region that does not have other conductive members except for sensing units 41 (conductive members). The sensing units 41 are disposed in the clear areas C. As a result, the constant voltage provided by the control unit 42 can be prevented from being conducted to other conductive members, and the capacitance variation of the sensing unit 41 can be accurately detected. In the present embodiment, the clear areas C may be disposed on a surface of the circuit board 30, and the present invention is not limited to the upper surface or the lower surface of the circuit board 30. FIG. 5 is an example of the lower surface of the circuit board 30. FIG. 5 is a partial schematic diagram of the lower surface of the circuit board shown in FIG. 2. Referring to FIG. 5, although the base plate 10 is a metal piece, and the circuit board 30 is disposed proximal to the base plate 10, the key structures 20 are accommodated in the opening portions 11, such that the circuit board 30 corresponds to the key structures 20, and the position without the trace or the grounding member can be used as the clear area of the present embodiment.

In the present embodiment, a metal coating layer is coated on the clear areas C. The metal coating layer is used as the sensing unit 41. That is, the sensing units 41 (e.g. metal coating layers) respectively correspond to the key structures 20 and are located below the opening portions 11. In other words, the lower surface of the circuit board 30 in the present embodiment has eight metal coating layers, respectively corresponding to the aforementioned arrow keys (key structures 20 corresponding to up, down, left, and right functions; key structures 20 corresponding to the A, S, D, and W key). The metal coating layers are used as the sensing units 41 of the capacitance sensing module 40, and are electrically connected to the controlling unit 42 through, for example, a trace.

As described above, the controlling unit 42 provides a constant voltage to the sensing unit 41 (e.g. a metal coating layer) and forms a sensing area at the arrow key corresponding to the sensing unit 41. When the finger (a conductor) presses the aforementioned arrow key, the sensing unit 41 undergoes a capacitance variation, and the controlling unit 42 detects the capacitance variation and generates a capacitance variation value. In short, when the key structure 20 proximal to the sensing unit 41 is pressed, the controlling unit 42 generates a capacitance variation value.

In detail, the sensing unit 41 can generate a capacitance variation according to a distance difference from the conductor, that is, the sensing unit 41 can generate a capacitance variation according to the distance between the sensing unit 41 and the finger (the conductor). For example, when the keycap 21 is not pressed, the sensing unit 41 stores the largest capacitance value. When the keycap 21 is pressed by the user's finger (the conductor), the distance between the finger (the conductor) and the sensing unit 41 (e.g. a metal coating layer) becomes smaller as the keycap 21 is pressed, and the capacitance stored in the sensing units 41 also becomes smaller. When the keycap 21 is pressed to the bottom (fully pressed), the distance between the finger and the sensing unit 41 is the smallest, and the capacitance stored by the sensing unit 41 is the smallest. In other words, the sensing unit 41 undergo a capacitance variation with the degree the key structures 20 are pressed (i.e. the distance difference between the sensing unit 41 and the conductor), and the controlling unit 42 detects the capacitance variation and generates a corresponding capacitance variation value.

Please refer to FIG. 3. The processing module 50 of the present embodiment can be disposed on the circuit board 30. The processing module 50 is electrically connected to the controlling unit 42 of the capacitance sensing module 40, and receives the capacitance variation value. The processing module 50 generates an input signal according to the capacitance variation value. Specifically, the processing module 50 in the present embodiment includes a memory unit 51 and a processing unit 52 coupled to each other. The memory unit 51 stores a capacitance variation input signal comparison table including a plurality of capacitance variation segments and the corresponding input signals. For example, the capacitance variation value measured when the keycap 21 of the key structures 20 is pressed to the bottom (fully pressed) can be defined as 100, and the capacitance variation value measured when the keycap 21 of the key structures 20 is not pressed is 0. The capacitance variation values between 0 and 100 are divided into a plurality of capacitance variation segments corresponding to different input signals. For example, the capacitance variation can be divided into four capacitance variation segments respectively corresponding to input signals of different speeds (fast, medium fast, medium slow, and slow) of the game target.

After receiving the capacitance variation value from the controlling unit 42, the processing unit 52 of the processing module 50 determines a pressed degree of the key structures 20 according to the capacitance variation value. That is, the processing unit 52 can determine that the capacitance variation value is in the range of one of the capacitance variation segments and generate a corresponding input signal. For example, when the processing unit 52 determines that the capacitance variation value is between 75 and 100, the processing unit 52 generates a fast-acting input signal; if the capacitance variation value is between 0 and 25, the processing unit 52 generates a slow-acting input signal.

In other embodiments, the processing unit 52 of the processing module 50 can also calculate to obtain a pressed depth according to the capacitance variation value. The memory unit 51 stores a pressed depth input signal comparison table including a plurality of pressed depth segments and the corresponding input signals. Similarly, the pressed depth can be divided into four pressed depth segments respectively corresponding to input signals of different speeds (fast, medium fast, medium slow, slow). The processing module 50 determines that the pressed depth is in the range of one of the pressed depth segments, and generates the corresponding input signal.

In other embodiments, the memory unit 51 can also store a capacitance variation pressed depth comparison table including a plurality of capacitance variation segments and the corresponding pressed depths. After receiving the capacitance variation from the controlling unit 42, the processing unit 52 of the processing module 50 can evaluate the capacitance variation segment according to the capacitance variation value, and then look up the table to obtain a pressed depth and output the pressed depth to the outside. In this way, the capacitance sensing module 40 can detect different capacitance values according to the pressed depth after the user's finger presses, and the processing module 50 further generates different numerical outputs so that the system or the user can know the pressed degree of the keys.

It should be noted that the current gaining keyboard is used to enhance the triggering effect of key structures. Two sheet metal springs are provided in the key structures, and the sheet metal springs are used to contact each other to achieve the signal triggering effect when pressing. The following embodiments are applied to the types of key structures described above.

Figure 6:
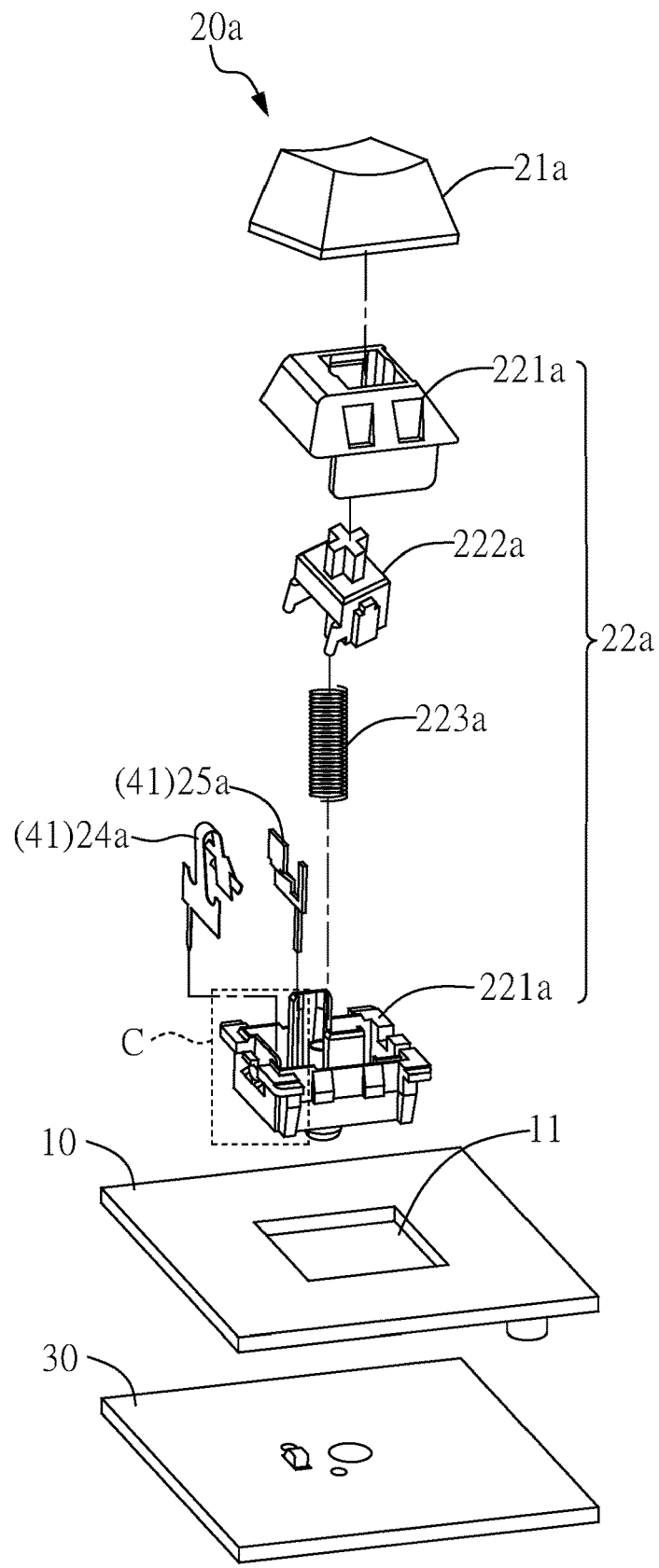
FIG. 6 is a schematic diagram of the key structures in another embodiment of the present invention.

FIG. 6 is a schematic diagram of key structures in another embodiment of the present invention. Hereafter please refer to FIG. 2, FIG. 3, and FIG. 6. The structures and the connection relationship of the keyboard 1 can be referred to the embodiment described above. Also, the component names other than the key structures 20a follow the embodiment described above. In the present embodiment, the key structures 20a respectively include a first sheet metal spring 24a and a second sheet metal spring 25a disposed opposite to each other in the housing 221a. The first sheet metal spring 24a and the second sheet metal spring 25a are electrically connected to the circuit board 30. For example, the first sheet metal spring 24a is electrically connected to a processing module through a trace on the circuit board 30 (in the present embodiment, the processing module may be the processing module 50 or another processing module on the circuit board 30), and the second sheet metal spring 25a is electrically connected to a ground on the circuit board 30. When the key structures 20a are pressed, the first sheet metal spring 24a and the second sheet metal spring 25a are in contact with each other to be on and generate a single trigger signal, and the processing module 50 generates a corresponding input signal.

In addition, at least a portion of the first sheet metal spring 24a is a conductive member, and the sensing unit 41 of the present embodiment is the conductive member, electrically connected to the controlling unit 42 on the circuit board 30 via a trace on the circuit board 30. The controlling unit 42 outputs a constant voltage to the sensing units 41, and can detect the capacitance variation of the sensing units 41. In detail, when the keycap 21a is pressed by the finger (the conductor) of the user, the housing 221a is a fixed piece, and the pressing member 222a is moved downward by the keycap 21a. Therefore, the relative distance between the finger and the sensing unit 41 (e.g. the first sheet metal spring 24a) is closer as the keycap 21a of the key structures 20a is pressed. When the key structures 20a are pressed to the bottom (fully pressed), the relative distance between the finger and the sensing units 41 is the closest. The sensing units 41 undergo capacitance variations with the degree of the key structures 20a are pressed, and the controlling unit 42 detects the capacitance variation and generates a capacitance variation value.

Since the key structures 20a are accommodated in the opening portions 11, the areas of the key structures 20a that do not have other conductive members may also serve as clear areas C. That is, the clear areas C may also be disposed in the key structures 20a, and the first sheet metal spring 24a or second sheet metal spring 25a can be used as the sensing units 41 of the capacitance sensing module 40. Specifically, the controlling unit 42 of the capacitance sensing module 40 is also disposed on the circuit board 30, if the pin of the controlling unit 42 is electrically connected to the first sheet metal spring 24a, the first sheet metal spring 24a is used as the sensing unit 41; if the pin of the controlling unit 42 is electrically connected to the second sheet metal spring 25a, the second sheet metal spring 25a is used as the sensing units 41. It should be noted that the controlling unit 42 can be electrically connected to parts or all of the key structures 20a, preferably the aforementioned arrow keys (the key structures 20a corresponding to the up, down, left, right, and A, S, D or W key).

The present embodiment is an example of the controlling unit 42 being electrically connected to the first sheet metal spring 24a. The controlling unit 42 can supply a constant voltage to the first sheet metal spring 24a. When the key structures 20a are pressed, the first sheet metal spring 24a generates a capacitance variation. The controlling unit 42 is electrically connected to the first sheet metal spring 24a, and thus the capacitance variation can be detected by first sheet metal spring 24a (the sensing units 41) and a capacitance variation value can be obtained.

In an embodiment, the processing module 50 can continuously send a request signal to the capacitance sensing module 40, to obtain the capacitance value of the sensing units 41 at each time point. When the key structures 20a are pressed, the first sheet metal spring 24a and the second sheet metal spring 25a are in contact with each other to generate a trigger signal. The processing module 50 can generate an input signal corresponding to different actuations according to the capacitance variation value generated by the capacitance sensing module 40. For other details, refer to the embodiment described above. The details will not be described herein.

In other embodiments, if the controlling unit 42 is electrically connected to the second sheet metal spring 25a, the second sheet metal spring 25a can be used as the sensing units 41. In this embodiment, the first sheet metal spring 24a is electrically connected to a ground on the circuit board 30, and the second sheet metal spring 25a is electrically connected to the processing module (in the present embodiment, the processing module may be the processing module 50) via a trace on the circuit board 30. In addition, at least a portion of the second sheet metal spring 25a is a conductive member, and the sensing unit 41 of the present embodiment is the conductive member electrically connected to the controlling unit 42 on the circuit board 30 via a trace on the circuit board 30. The controlling unit 42 outputs a constant voltage to the sensing unit 41, and can detect the capacitance variation of the sensing unit 41. Similarly, when the key structures 20a are pressed, the first sheet metal spring 24a and the second sheet metal spring 25a are in contact with each other to generate a trigger signal, and the processing module 50 correspondingly generates a single input signal. When the keycap 21a is pressed by a finger (the conductor), the relative distance of the finger from the sensing units 41 is smaller as the key structures 20a are pressed. In other words, when the key structures 20a are pressed to the bottom (fully pressed), the relative distance between the fingers and the sensing units 41 is the closest. The sensing units 41 undergo a capacitance variation with the degree the key structures 20a are pressed, and the controlling unit 42 detects the capacitance variation and generates a capacitance variation value. The processing module 50 further generates an input signal corresponding to different actuations according to the capacitance variation value generated by the capacitance sensing module 40. For other details, refer to the embodiment described above. The details will not be described herein.

As described above, the keyboard according to the present invention includes a capacitance sensing module and a processing module. The capacitance sensing module includes a plurality of sensing units and a controlling unit. The sensing units are respectively disposed in the clear areas proximal to parts of the key structures. The controlling unit is disposed on a circuit board and electrically connected to the sensing units. When the key structures proximal to the sensing units are pressed, the controlling unit can detect and obtain a capacitance variation value. The processing module generates a corresponding input signal according to the capacitance variation value. The capacitance variation value may vary depending on the pressed depth of the key structures. The processing module can determine the pressed degree of the key structures according to different capacitance variation values, and generate a corresponding input signal. In other words, through the principle of capacitance variation, the effect that a single key structure can generate multiple different input signals can be achieved. Moreover, due to the small size of the sensing units of the capacitance sensing module, the sheet metal spring of the key structures can be directly used as the sensing units. Compared with the conventional keyboard using the light reflection principle, the keyboard according to the present invention can save space and reduce the manufacturing cost.

The objectives, means, and efficiency of the present invention are all different from conventional characteristics in the prior art. It will be appreciated if the committee can review and grant a patent to benefit the society. However, it should be noted that the described embodiments are only for illustrative and exemplary, and that various changes and modifications may be made to the described embodiments without departing from the scope of the invention as disposed by the appended claims.

What is claimed is:

1. A keyboard, comprising:
    a base plate, including a plurality of opening portions;
    a plurality of key structures, respectively disposed in the opening portions;
    a circuit board, disposed on a surface of the base plate; and
    a capacitance sensing module, comprising:
        a plurality of sensing units, respectively disposed in a plurality of clear areas respectively proximal to the key structures, the sensing unit is a conductive member, the clear areas are disposed on a surface of the circuit board, and a metal coating layer is coated on each of the clear areas, wherein the metal coating layer is used as the sensing unit;
        a controlling unit, disposed on the circuit board and electrically connected to the sensing units, wherein when the key structure is pressed by a conductor, the corresponding sensing unit generates a capacitance variation in accordance with a pressed degree of the key structure and a distance difference from the conductor, and the controlling unit detects the capacitance variation and generates a capacitance variation value; and
    a processing module, electrically connected to the controlling unit of the capacitance sensing module and receiving the capacitance variation value, wherein the processing module according to the capacitance variation value generates a corresponding input signal.

2. The keyboard as claimed in claim 1, wherein the processing module comprises a memory unit that stores a capacitance variation input signal comparison table including a plurality of capacitance variation segments and the corresponding input signal, and the processing module determines that the capacitance variation value is in the range of one of the capacitance variation segments, and generates the corresponding input signal.

3. The keyboard as claimed in claim 1, wherein the processing module comprises a memory unit that stores a pressed depth input signal comparison table including a plurality of pressed depth segments and the corresponding input signal, and the processing module calculates to obtain a pressed depth according to the capacitance variation value, and determines that the pressed depth is in the range of one of the pressed depth segments, and generates the corresponding input signal.

4. The keyboard as claimed in claim 1, wherein the processing module comprises a memory unit that stores a capacitance variation pressed depth comparison table including a plurality of capacitance variation segments and a corresponding pressed depth, and the processing module obtains the pressed depth according to the capacitance variation value.

5. The keyboard as claimed in claim 1, wherein when the key structure is pressed by a conductor, the corresponding sensing unit generates the capacitance variation according to a distance difference from the conductor, and wherein the controlling unit detects the capacitance variation and generates the capacitance variation value.

6. A keyboard, comprising:
    a base plate, including a plurality of opening portions;
    a plurality of key structures, respectively disposed in the opening portions, the key structure includes a first sheet metal spring and a second sheet metal spring disposed opposite to each other;
    a circuit board, disposed on a surface of the base plate; and
    a capacitance sensing module, comprising:
        a plurality of sensing units, respectively disposed in a plurality of clear areas respectively proximal to the key structures, the sensing unit is a conductive member, the clear areas are disposed on the key structures,
        a controlling unit, disposed on the circuit board and electrically connected to the sensing units, wherein when the key structure is pressed by a conductor, the corresponding sensing unit generates a capacitance variation in accordance with a pressed degree of the key structure and a distance difference from the conductor, and the controlling unit detects the capacitance variation and generates a capacitance variation value, wherein the controlling unit is electrically connected to the first sheet metal spring, and the first sheet metal spring is used as the sensing units; and
    a processing module, electrically connected to the controlling unit of the capacitance sensing module and receiving the capacitance variation value, wherein the processing module according to the capacitance variation value generates a corresponding input signal.

7. The keyboard as claimed in claim 6, wherein when the key structure is pressed, the first sheet metal spring and the second sheet metal spring are in contact with each other, and generate a trigger signal, and the processing module correspondingly generates the input signal.

8. The keyboard as claimed in claim 6, wherein the key structures proximal to the clear areas are a plurality of arrow keys.

9. The keyboard as claimed in claim 8, wherein the arrow keys comprise the key structures corresponding to up, down, left, right, and A, S, D, or W key.

10. A keyboard, comprising:
a base plate, including a plurality of opening portions;
a plurality of key structures, respectively disposed in the opening portions;
a circuit board, disposed on a surface of the base plate;
a capacitance sensing module, comprising:
    a plurality of sensing units, respectively disposed in a plurality of clear areas respectively proximal to the key structures;
    a controlling unit, disposed on the circuit board and electrically connected to the sensing units, wherein when the key structure is pressed by a conductor, the corresponding sensing unit generates a capacitance variation in accordance with a pressed degree of the key structure and a distance difference from the conductor, and the controlling unit detects the capacitance variation and generates a capacitance variation value; and
a processing module, electrically connected to the controlling unit of the capacitance sensing module and receiving the capacitance variation value, wherein the processing module according to the capacitance variation value generates a corresponding input signal, the processing module comprising:
    a memory unit that stores a capacitance variation input signal comparison table, a pressed depth input signal comparison table, or a capacitance variation pressed depth comparison table,
    wherein the capacitance variation input signal comparison table includes a plurality of capacitance variation segments and the corresponding input signal, and the processing module determines that the capacitance variation value is in the range of one of the capacitance variation segments, and generates the corresponding input signal,
    wherein the pressed depth input signal comparison table includes a plurality of pressed depth segments and the corresponding input signal, and the processing module calculates to obtain a pressed depth according to the capacitance variation value, and determines that the pressed depth is in the range of one of the pressed depth segments, and generates the corresponding input signal,
    wherein the capacitance variation pressed depth comparison table includes a plurality of capacitance variation segments and a corresponding pressed depth, and the processing module obtains the pressed depth according to the capacitance variation value.

11. The keyboard as claimed in claim 1, wherein the key structures proximal to the clear areas are a plurality of arrow keys.

12. The keyboard as claimed in claim 11, wherein the arrow keys comprise the key structures corresponding to up, down, left, right, and A, S, D, or W key.

13. The keyboard as claimed in claim 1, wherein the sensing unit is a conductive member.

14. The keyboard as claimed in claim 13, wherein the clear areas are disposed on a surface of the circuit board, and a metal coating layer is coated on each of the clear areas, wherein the metal coating layer is used as the sensing unit.

15. The keyboard as claimed in claim 13, wherein the clear areas are disposed on the key structures, and the key structure includes a first sheet metal spring and a second sheet metal spring disposed opposite to each other.

16. The keyboard as claimed in claim 15, wherein when the key structure is pressed, the first sheet metal spring and the second sheet metal spring are in contact with each other, and generate a trigger signal, and the processing module correspondingly generates the input signal.

17. The keyboard as claimed in claim 15, wherein the controlling unit is electrically connected to the first sheet metal spring, and the first sheet metal spring is used as the sensing units.

* * * * *